(12) United States Patent
Nishimori

(10) Patent No.: US 10,008,986 B2
(45) Date of Patent: Jun. 26, 2018

(54) POWER AMPLIFICATION APPARATUS AND METHOD FOR CONTROLLING POWER AMPLIFICATION APPARATUS

(71) Applicant: FUJITSU LIMITED, Kawasaki-shi, Kanagawa (JP)

(72) Inventor: Masato Nishimori, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/424,860

(22) Filed: Feb. 5, 2017

(65) Prior Publication Data

US 2017/0264247 A1    Sep. 14, 2017

(30) Foreign Application Priority Data

Mar. 9, 2016 (JP) ................. 2016-045732

(51) Int. Cl.
| | | |
|---|---|---|
| H03F 3/68 | (2006.01) | |
| H03F 1/02 | (2006.01) | |
| H03F 3/19 | (2006.01) | |
| H03F 3/21 | (2006.01) | |
| H03F 3/24 | (2006.01) | |

(52) U.S. Cl.
CPC ......... *H03F 1/0288* (2013.01); *H03F 1/0272* (2013.01); *H03F 3/19* (2013.01); *H03F 3/21* (2013.01); *H03F 3/245* (2013.01); *H03F 2200/451* (2013.01); *H03F 2200/462* (2013.01); *H03F 2200/555* (2013.01)

(58) Field of Classification Search
CPC ............ H03F 1/0288; H03F 1/07; H03F 3/68
See application file for complete search history.

(56) References Cited

U.S. PATENT DOCUMENTS

| | | | |
|---|---|---|---|
| 8,816,775 B2 * | 8/2014 | Annes | .................. H03F 1/0288 330/285 |
| 2010/0289585 A1 | 11/2010 | Tomizawa et al. | |

FOREIGN PATENT DOCUMENTS

| | | |
|---|---|---|
| JP | 2010-268393 | 11/2010 |
| JP | 2010-273018 | 12/2010 |
| JP | 2012-199746 | 10/2012 |
| JP | 2013-077980 | 4/2013 |
| JP | 2013-247501 | 12/2013 |

* cited by examiner

*Primary Examiner* — Steven J Mottola
(74) *Attorney, Agent, or Firm* — Fujitsu Patent Center

(57) ABSTRACT

A power amplification apparatus which is a Doherty power amplification apparatus includes a main amplifier configured to amplify an input signal, and an auxiliary amplifier configured to amplify the input signal when a level of the input signal is higher than a predetermined level. The power amplification apparatus includes an auxiliary amplifier threshold value shift detector configured to detect a threshold value shift in the auxiliary amplifier; and an auxiliary amplifier bias voltage adjustment circuit configured to adjust a bias voltage of the auxiliary amplifier based on the detected threshold value shift in the auxiliary amplifier.

12 Claims, 12 Drawing Sheets

POWER AMPLIFICATION APPARATUS AND METHOD FOR CONTROLLING POWER AMPLIFICATION APPARATUS

CROSS-REFERENCE TO RELATED APPLICATION

This application is based upon and claims the benefit of priority of the prior Japanese Patent Application No. 2016-045732, filed on Mar. 9, 2016, the entire contents of which are incorporated herein by reference.

FIELD

The embodiments discussed herein are related to a power amplification apparatus and a method for controlling the power amplification apparatus.

BACKGROUND

In recent years, increase of communication data amounts in wireless communications have resulted in, for example, demands for the enhancement of the transmitter power output of base stations. In addition, interest has focused on Doherty power amplification apparatuses including a main amplifier (carrier amplifier) which amplifies an input signal and an auxiliary amplifier (peak amplifier) which amplifies the input signal when the input signal level is higher than a predetermined level, as microwave power amplifiers capable of achieving wide bands and high efficiency.

For example, a gallium nitride (GaN) device may be used as, for example, a power amplification apparatus in a base station. Such GaN devices have wider band gaps and higher mobility than other semiconductor devices (for example, a silicon laterally diffused metal oxide semiconductor (Si-LDMOS), a gallium arsenide field effect transistor (GaAs-FET), and the like), and therefore have excellent high-frequency and high-output characteristics.

In a GaN device, an increase in input power is known to cause a phenomenon, known as an Idq drift, in which an idling current (i.e., drain current on standby during which no signal is input into an amplifier) fluctuates (see, for example, Patent Documents 1 and 2). One cause of the occurrence of the Idq drift is considered to be a threshold value shift.

In other words, an occurrence of a threshold value shift causes an idling current to vary, and furthermore, a fluctuation in idling current causes a gain to fluctuate. Therefore, for example, an amplifier to which a GaN device is applied (power amplification apparatus) has a problem in that gain compensation by a distortion compensation method such as digital pre-distortion (DPD) is precluded, thereby resulting in deterioration of the performance of the distortion compensation.

In order to solve such a problem, for example, there has been known a technique in which an idling current is monitored, and a bias voltage (gate voltage) is applied so that the idling current is within a defined range. In addition, for example, there has been proposed a technique in which an idling current value is determined from the minimum value of a drain current value at the time of RF operation (operation of amplification of high frequency), and a bias voltage (gate bias) is applied to perform distortion compensation based on the idling current value (see, for example, Patent Document 3).

As described above, for example, in a Doherty power amplification apparatus to which a GaN device is applied, there has been proposed a technique, for example, in which an idling current value is determined from the minimum value of a drain current value at the time of RF operation, and a bias voltage is applied to perform distortion compensation based on the idling current value.

However, a main amplifier ordinarily operates in, for example, Class A or Class AB. Therefore, even if an idling current value can be determined from the minimum value of a drain current value, it is difficult to determine the idling current value by a similar technique because an auxiliary amplifier operates in, for example, Class C.

In other words, it is difficult to perform appropriate distortion compensation for a threshold value shift occurring in the auxiliary amplifier of the Doherty power amplification apparatus.

Incidentally, in the past, there have been proposed various Doherty power amplification apparatuses and various power amplification apparatuses to which GaN devices are applied.

Patent Document 1: Japanese Laid-open Patent Publication No. 2010-268393
Patent Document 2: Japanese Laid-open Patent Publication No. 2013-077980
Patent Document 3: Japanese Laid-open Patent Publication No. 2013-247501
Patent Document 4: Japanese Laid-open Patent Publication No. 2012-199746
Patent Document 5: Japanese Laid-open Patent Publication No. 2010-273018

SUMMARY

According to an aspect of the embodiments, there is provided a power amplification apparatus which is a Doherty power amplification apparatus including a main amplifier configured to amplify an input signal, and an auxiliary amplifier configured to amplify the input signal when a level of the input signal is higher than a predetermined level. The power amplification apparatus includes an auxiliary amplifier threshold value shift detector and an auxiliary amplifier bias voltage adjustment circuit.

The auxiliary amplifier threshold value shift detector is configured to detect a threshold value shift in the auxiliary amplifier, and the auxiliary amplifier bias voltage adjustment circuit is configured to adjust a bias voltage of the auxiliary amplifier based on the detected threshold value shift in the auxiliary amplifier.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
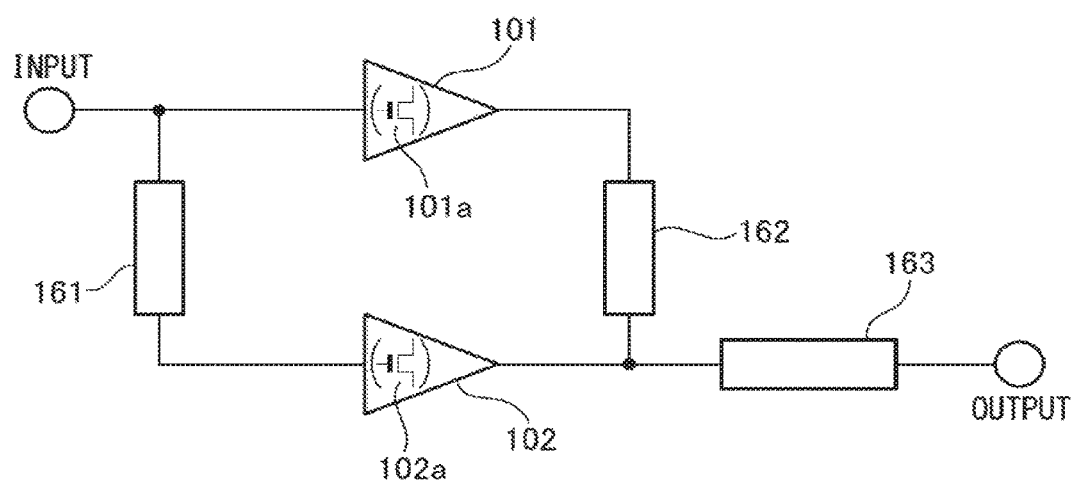
FIG. 1 is a block diagram illustrating an example of a power amplification apparatus.

First, before describing embodiments of a power amplification apparatus and a method for controlling the power amplification apparatus, an example of a power amplification apparatus and the problems of the example will be described with reference to FIG. 1 to FIG. 4B. FIG. 1 is a block diagram illustrating an example of the power amplification apparatus, and simplistically illustrates the Doherty power amplification apparatus (Doherty amplifier).

As illustrated in FIG. 1, the Doherty power amplification apparatus includes a main amplifier (carrier amplifier) 101 which amplifies an input signal, and an auxiliary amplifier (peak amplifier) 102 which amplifies the input signal when the input signal level becomes higher than a predetermined level. In FIG. 1, reference numerals 161 to 163 denote λ/4 transmission lines (¼ wavelength transmission lines).

For example, a GaN device 101a is applied to the main amplifier 101, and a GaN device 102a is applied to the auxiliary amplifier 102. Ordinarily, the main amplifier 101 operates in Class A or Class AB, and the auxiliary amplifier 102 operates in Class B or Class C.

As described above, it is considered that, in a GaN device, an increase in input power causes a phenomenon, known as an Idq drift, in which an idling current (drain current on standby) fluctuates, and one cause of the occurrence of the phenomenon is a threshold value shift.

Figure 2A:
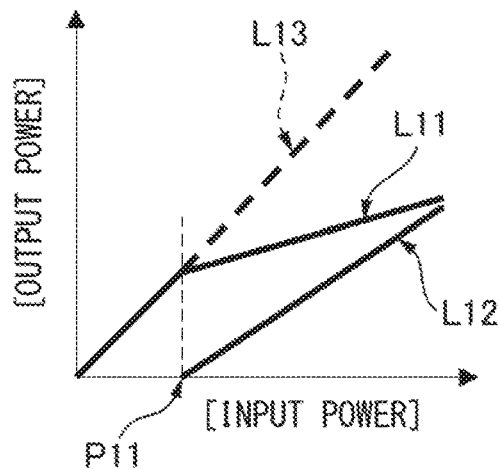
FIG. 2A, FIG. 2B, and FIG. 2C are views for explaining a threshold value shift in the power amplification apparatus illustrated in FIG. 1.
Figure 2B:
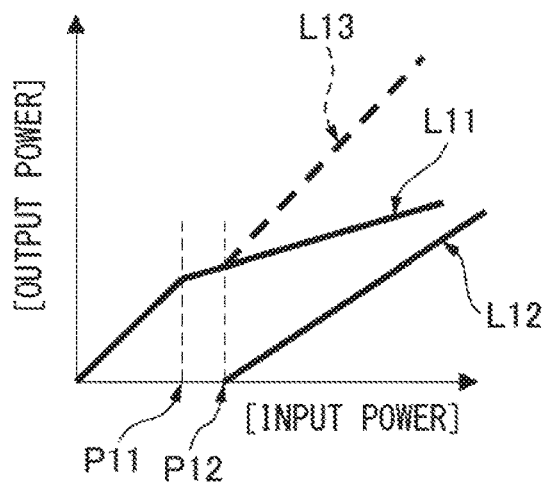
Figure 2C:
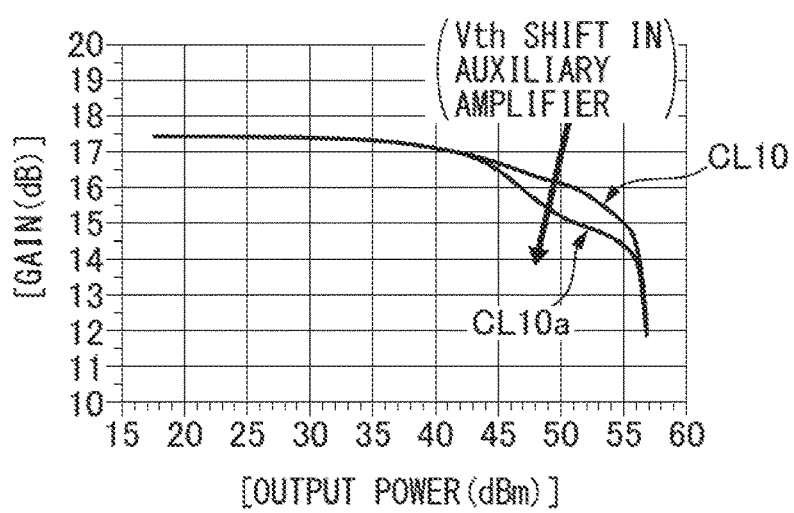

FIG. 2A, FIG. 2B, and FIG. 2C are views for explaining a threshold value shift in the power amplification apparatus illustrated in FIG. 1, and for explaining the threshold value shift (Vth shift) of the auxiliary amplifier 102 in the power amplification apparatus (Doherty amplifier) in FIG. 1.

FIG. 2A illustrates a case in which the threshold value shift does not occur (before the occurrence of the Vth shift), and FIG. 2B illustrates a case in which the threshold value shift has occurred (after the occurrence of the Vth shift). Furthermore, FIG. 2C illustrates variations in the characteristics of the output power of the Doherty amplifier before and after the occurrence of the Vth shift in the auxiliary amplifier 102.

In each of FIG. 2A and FIG. 2B, the vertical axis indicates an output power, and the horizontal axis indicates an input power. Reference character L11 denotes a characteristic (input power/output power characteristic) of the main amplifier 101, reference character L12 denotes characteristics of the auxiliary amplifier 102, and reference character L13 denote characteristics of the Doherty amplifier, obtained by combining the corresponding output powers of the main amplifier 101 and the auxiliary amplifier 102.

Furthermore, in FIG. 2C, the vertical axis indicates a gain (dB), and the horizontal axis indicates an output power (dBm). Reference character CL10 denotes a characteristic (output power/gain characteristic) before the occurrence of the Vth shift in the auxiliary amplifier 102, and reference character CL10a denotes a characteristic after the occurrence of the Vth shift in the auxiliary amplifier 102.

As illustrated in FIG. 2A, for example, in a region in which an input signal level (input power) is a predetermined level P11 or lower, only the main amplifier 101 performs amplification operation, and the output power L11 of the main amplifier 101 is the output power (L13) of the Doherty amplifier (power amplification apparatus). When the input power is higher than P11, the auxiliary amplifier 102 starts amplification operation, and the output power L13 of the Doherty amplifier is a power obtained by combining (adding) the output power L11 of the main amplifier 101 and the output power L12 of the auxiliary amplifier 102. As illustrated in FIG. 2A, for example, when the Vth shift does not occur in the auxiliary amplifier 102, the characteristic of the Doherty amplifier linearly varies.

As illustrated in FIG. 2B, when the Vth shift then occurs in the auxiliary amplifier 102, for example, when the threshold voltage (Vth) of the auxiliary amplifier 102 shifts to a higher level, an input power level at which the auxiliary amplifier 102 starts amplification operation varies from P11 to P12. In other words, the auxiliary amplifier 102 does not start amplification operation immediately even after the input power becomes higher than P11 but starts the amplification operation after the input power becomes higher than P12. Therefore, as illustrated in FIG. 2B, for example, the characteristic of the Doherty amplifier nonlinearly varies when the Vth shift occurs in the auxiliary amplifier 102.

As a result, as illustrated in FIG. 2C, the characteristic curve CL10 of the output power/gain before the occurrence of the Vth shift of the auxiliary amplifier 102 varies in a manner similar to that in the case of the characteristic curve CL10a (so that a gain decreases) when the Vth shift occurs (when the Vth shifts to a higher level).

Figure 3A:
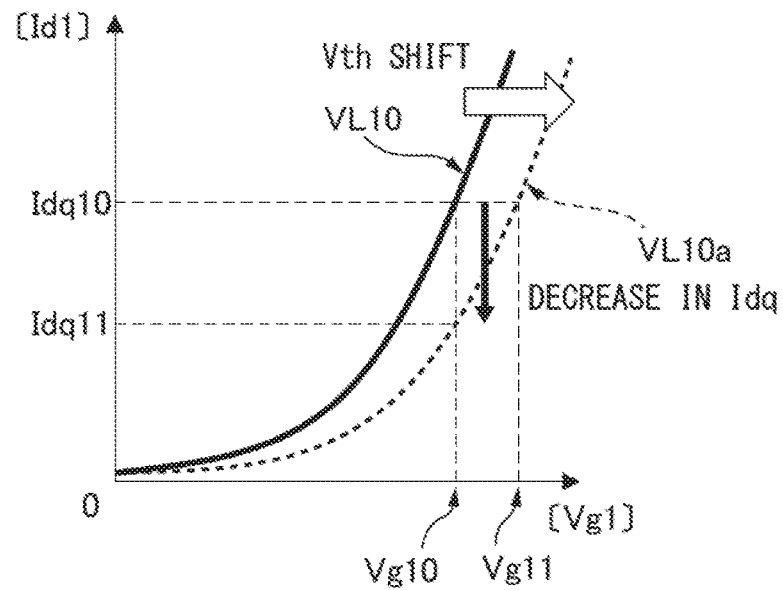
FIG. 3A and FIG. 3B are views for explaining the threshold value shift in a main amplifier in the power amplification apparatus illustrated in FIG. 1.
Figure 3B:
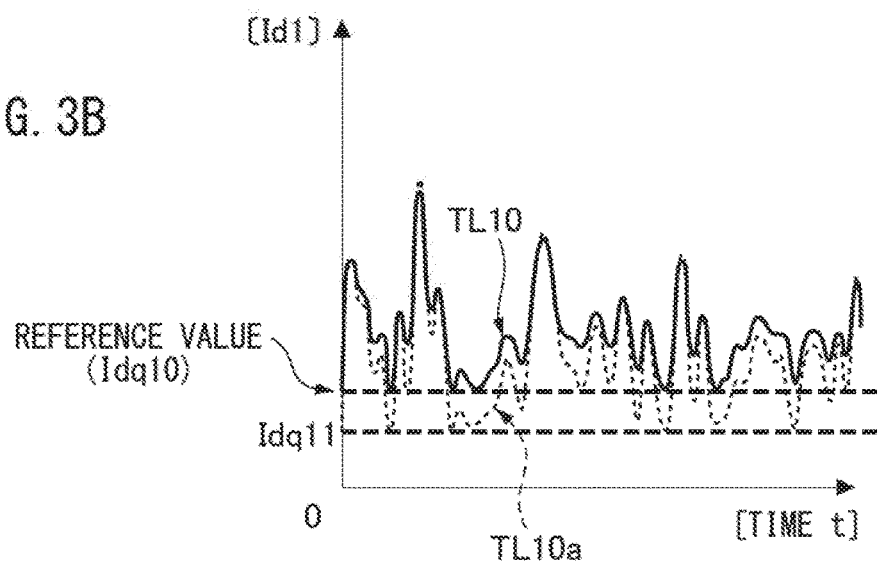

FIG. 3A and FIG. 3B are views for explaining the threshold value shift in the main amplifier in the power amplification apparatus illustrated in FIG. 1. FIG. 3A represents a relationship between a bias voltage (gate voltage) Vg and a current Id1 passing through the main amplifier 101 (a drain current of main amplifier 101) before and after the occurrence of the Vth shift in the main amplifier 101, and FIG. 3B represents a relationship between a time t and the drain current Id1.

In FIG. 3A, reference character VL10 denotes a characteristic (gate voltage/drain current characteristic) before the occurrence of the Vth shift in the main amplifier 101, and reference character VL10a denotes a characteristic after the occurrence of the Vth shift in the main amplifier 101.

In FIG. 3B, reference character TL10 denotes a characteristic (time/drain current characteristic) before the occurrence of the Vth shift in the main amplifier 101, and reference character TL10a denotes a characteristic after the occurrence of the Vth shift in the main amplifier 101.

The minimum value (Idqp10: reference value) of the characteristic curve TL10 corresponds to an idling current of the Vth shift before the occurrence of the Vth shift in the main amplifier 101, and the minimum value (Idqp11) of the characteristic curve TL10a corresponds to an idling current after the occurrence of the Vth shift in the main amplifier 101.

As illustrated in FIG. 3A, for example, when the Vth in the main amplifier 101 shifts to a higher level, the idling current (drain current) Id1 varies from Idqp10 to Idqp11. Because the main amplifier 101 operates, for example, in Class A or Class AB, the levels of Idqp10 and Idqp11 can be ordinarily distinguished from each other as illustrated in FIG. 3B.

In other words, a certain level of current passes through the main amplifier 101 even during idling, and therefore, the difference between the levels of Idqp10 and Idqp11 can be determined, for example, even when the Vth shifts to a higher level, and the idling current Id1 decreases from Idqp10 to Idqp11.

Thus, the occurrence of the Vth shift is recognized on the basis of the decrease (Idqp10 to Idqp11) in the idling current of the main amplifier 101, so that the Vth shift can be compensated (corrected) by, for example, changing a gate voltage Vg1 from Vg10 to Vg11.

In such a manner, the amount (amplitude) of a Vth shift can be determined from the amount of fluctuation in idling current (drain current), for example, even if the Vth shift occurs in the main amplifier 101 in Class AB operation or Class A operation which operates with setting an idling current value at a certain level or higher. Distortion compensation is enabled by, for example, applying a gate voltage (bias voltage) equivalent to the amount of the Vth shift.

Figure 4A:
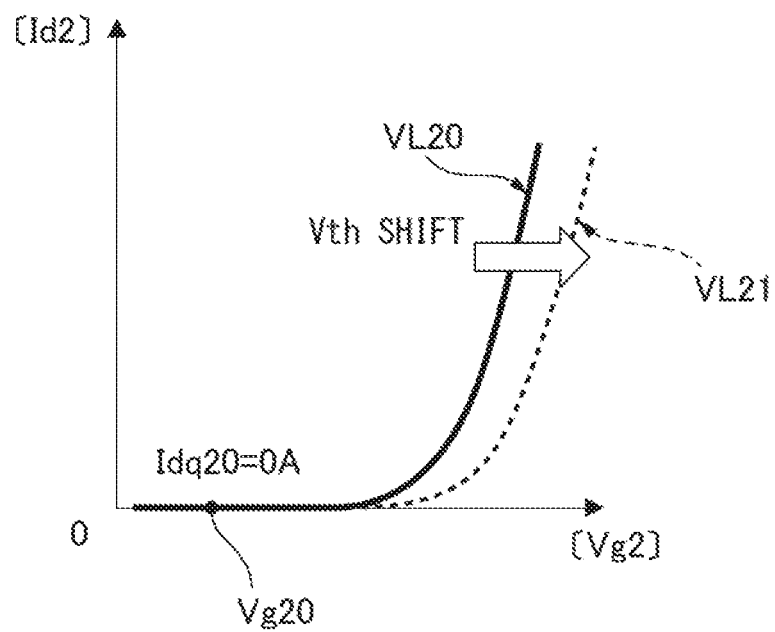
FIG. 4A and FIG. 4B are views for explaining the threshold value shift in an auxiliary amplifier in the power amplification apparatus illustrated in FIG. 1.
Figure 4B:
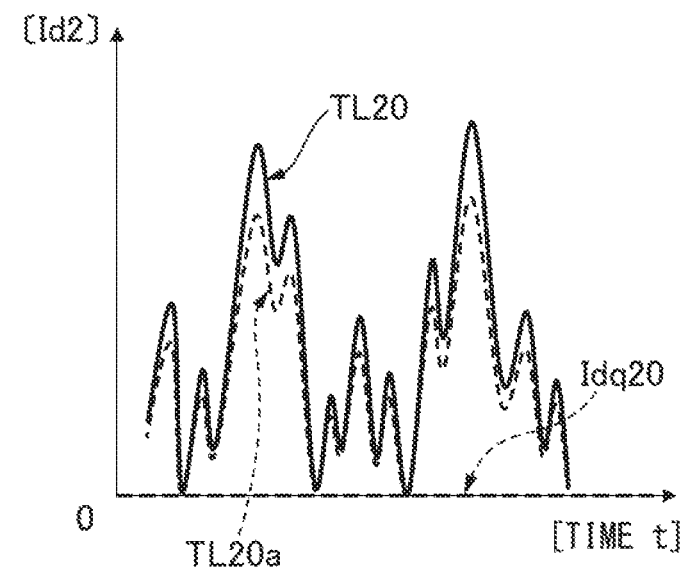

FIG. 4A and FIG. 4B are views for explaining the threshold value shift in the auxiliary amplifier in the power amplification apparatus illustrated in FIG. 1. FIG. 4A represents a relationship between a bias voltage (gate voltage) Vg2 and a current Id2 passing through the auxiliary amplifier 102 (a drain current of the auxiliary amplifier 102) before and after the occurrence of the Vth shift in the auxiliary amplifier 102, and FIG. 4B represents a relationship between a time t and the drain current Id2.

In FIG. 4A, reference character VL20 denotes a characteristic (gate voltage/drain current characteristic) before the occurrence of the Vth shift in the auxiliary amplifier 102, and reference character VL21 denotes a characteristic after the occurrence of the Vth shift in the auxiliary amplifier 102. In FIG. 4B, reference character TL20 denotes a characteristic (time/drain current characteristic) before the occurrence of the Vth shift in the auxiliary amplifier 102, and reference character TL20a denotes a characteristic after the occurrence of the Vth shift in the auxiliary amplifier 102.

As is apparent from comparisons of FIG. 4A and FIG. 4B as well as FIG. 3A and FIG. 3B, the auxiliary amplifier 102 operates in, for example, Class C, and therefore, an initial idling current value Idq20 is zero (Idq20=0 [A]) regardless of the occurrence of the Vth shift.

Therefore, in the auxiliary amplifier 102, it is not easy to distinguish the levels of the minimum value (Idqp20) of a characteristic curve TL20 before the occurrence of the Vth shift and the minimum value (Idqp20) of a characteristic curve TL20a after the occurrence of the Vth shift from each other.

In other words, even if a Vth shift occurs, for example, in the auxiliary amplifier 102 in Class C operation, it is difficult to compensate distortion caused by the Vth shift. As a result, the performance of the Doherty amplifier may be deteriorated by gain fluctuations.

Figure 5:
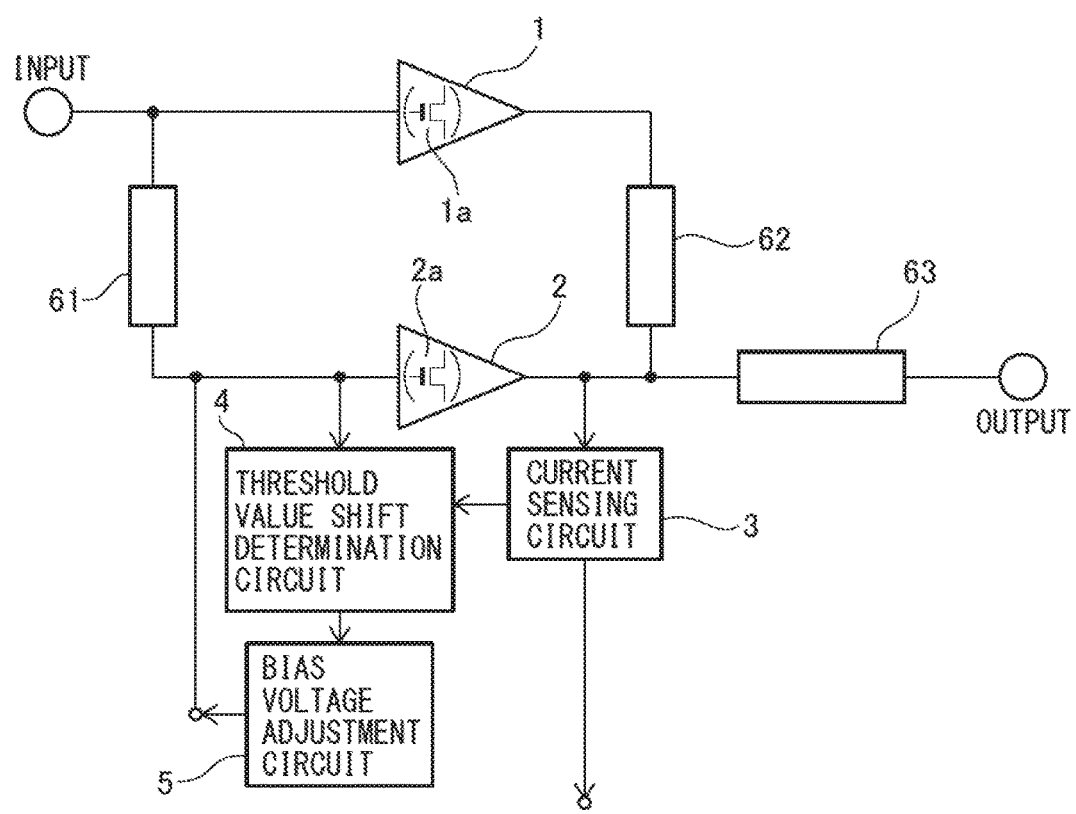
FIG. 5 is a block diagram illustrating an embodiment of a power amplification apparatus.

Embodiments of a power amplification apparatus and a method for controlling a power amplification apparatus will be described in detail below with reference to the accompanying drawings. FIG. 5 is a block diagram illustrating an embodiment of the power amplification apparatus, and illustrating the Doherty power amplification apparatus including a main amplifier (carrier amplifier) and an auxiliary amplifier (peak amplifier).

As illustrated in FIG. 5, the power amplification apparatus includes a main amplifier 1, an auxiliary amplifier 2, a current sensing circuit (auxiliary amplifier current sensing circuit) 3, a threshold value shift determination circuit (auxiliary amplifier threshold value shift determination circuit) 4, and a bias voltage adjustment circuit (auxiliary amplifier bias voltage adjustment circuit) 5. In FIG. 5, reference numerals 61 to 63 denote λ/4 transmission lines (¼ wavelength transmission lines).

For example, a GaN device 1a is applied to the main amplifier 1, and a GaN device 2a is applied to the auxiliary amplifier 2. Ordinarily, the main amplifier 1 operates in Class A or Class AB, and the auxiliary amplifier 2 operates in Class B or Class C.

The current sensing circuit 3 and the threshold value shift determination circuit 4 function as a threshold value shift detector (auxiliary amplifier threshold value shift detector), and detect the threshold value shift in the auxiliary amplifier 2. The current sensing circuit 3 senses the value of current passing through the auxiliary amplifier 2 with respect to a predetermined input power into the auxiliary amplifier 2.

The threshold value shift determination circuit 4 determines the threshold value shift in the auxiliary amplifier 2 when the value of the current passing through the auxiliary amplifier 2 deviates from reference values with respect to the predetermined input power into the auxiliary amplifier 2. In other words, the threshold value shift determination circuit 4 compares the values of currents passing through the auxiliary amplifier 2 with the corresponding reference values of the currents passing through the auxiliary amplifier 2 with respect to plural input powers into the auxiliary amplifier 2, and determines the threshold value shifts of the auxiliary amplifier 2.

The bias voltage adjustment circuit 5 adjusts the bias voltages (gate voltages Vg) of the auxiliary amplifier 2 with respect to the input powers into the auxiliary amplifier 2 so that the values of the currents passing through the auxiliary amplifier 2 are allowed to approach the reference values of the currents passing through the auxiliary amplifier 2 with respect to the input powers into the auxiliary amplifier 2.

The reference values of the currents (drain currents Idp) passing through the auxiliary amplifier 2, and the gate voltages (Vg) of the auxiliary amplifier 2 that compensates the threshold value shifts of the auxiliary amplifier 2 are learned with respect to the plural input powers and prepared in advance as described in detail later.

The bias voltage adjustment circuit 5 adjusts the gate voltages so that the initial values of the gate voltages are increased to allow the current values of the auxiliary amplifier 2 to approach the reference values when the values of the currents with respect to the predetermined input powers are less than the reference values, and a threshold voltage is lower than a reference threshold voltage. The current sensing circuit 3 senses the values of the currents passing through the auxiliary amplifier 2 with respect to the predetermined input powers into the auxiliary amplifier 2. The threshold voltage of the auxiliary amplifier 2 is determined by the threshold value shift determination circuit 4.

Figure 6:
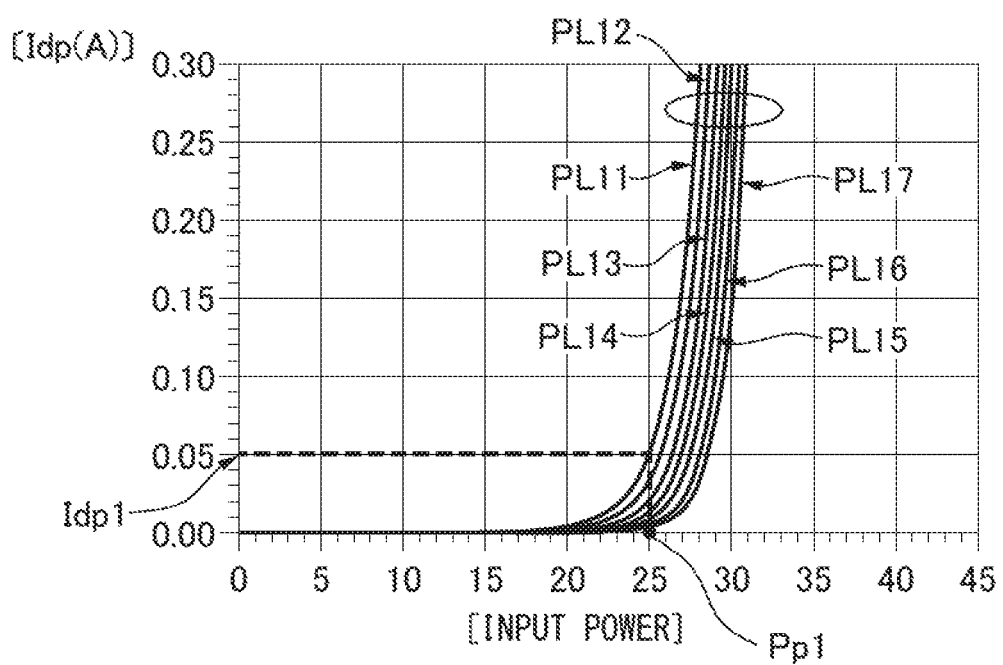
FIG. 6 is a view (1) for explaining an example of operation in a first embodiment of a power amplification apparatus.
Figure 7A:
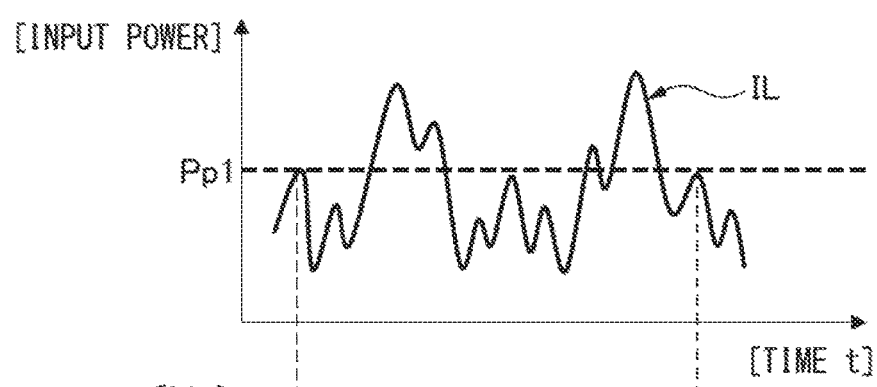
FIG. 7A and FIG. 7B are views (2) for explaining an example of operation in the first embodiment of the power amplification apparatus.
Figure 7B:
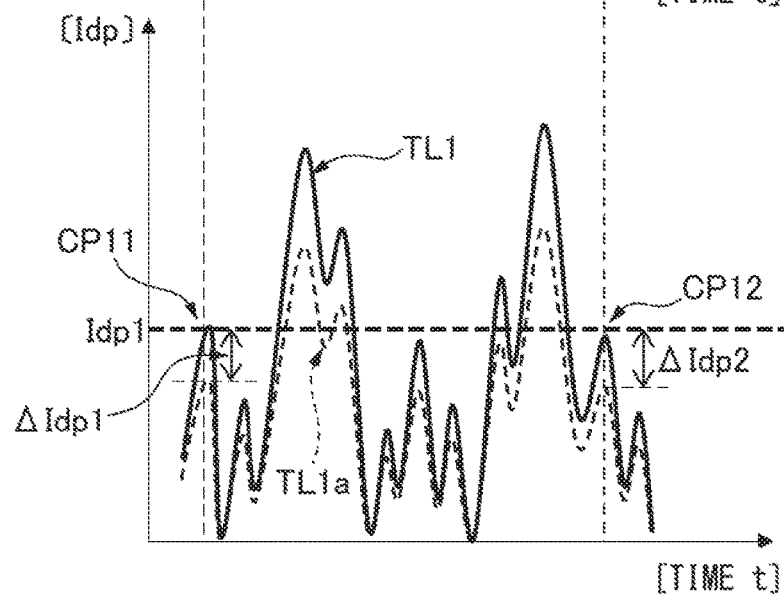

FIG. 6, FIG. 7A, and FIG. 7B are views for explaining an example of operation in a first embodiment of a power amplification apparatus. In the power amplification apparatus of the first embodiment, a variation in the drain current value (Idp) of an auxiliary amplifier 2 is learned in advance with respect to a certain input power (Pp1) into the auxiliary amplifier 2.

FIG. 6 represents the characteristic of the auxiliary amplifier 2 (characteristic of input power/current (drain current Idp) passing through the auxiliary amplifier 2), FIG. 7A represents a relationship between a time t and an input power, and FIG. 7B represents a relationship between a time t and a drain current Idp.

First, as illustrated in FIG. 6, input power/drain current characteristics PL11 to PL17 are learned in advance, for example, by sequentially varying the gate voltage (bias voltage) Vg of the auxiliary amplifier 2 with respect to the input power Pp1 into the auxiliary amplifier 2.

Specifically, the input power/drain current characteristics PL11 to PL17 with respect to the corresponding gate voltages Vg are learned in advance, for example, letting the characteristic curve PL11 in the case of a gate voltage Vg of 0 [V] (Vg=0), PL12 in the case of Vg=+0.001 [V], PL13 in the case of Vg=+0.002 [V], etc. The case of Vg=0 corresponds to a case in which any threshold value shift in the auxiliary amplifier 2 does not occur, and compensation for a gain by adjustment of the gate voltage is unneeded.

When the characteristic curves PL11 to PL17 are determined, learning processing at the input power Pp1 is preferably performed at points where the drain current Idp of the auxiliary amplifier 2 gently varies with respect to a variation in the gate voltage Vg of the auxiliary amplifier 2. As a result, the input power/drain current characteristics (PL11 to PL17) with respect to the corresponding gate voltages Vg of the auxiliary amplifier 2 can be prepared.

When the power amplification apparatus (Doherty amplifier) performs operation (RF operation), the input power into the auxiliary amplifier 2 varies with respect to a time t, as illustrated in FIG. 7A. For example, points (CP11, CP12) at which the maximum value of the input power into the auxiliary amplifier 2 is Pp1 are checked.

In this case, when no threshold value shift occurs in the auxiliary amplifier 2 (characteristic curve TL1) as illustrated in FIG. 7B, for example, the drain current Idp of the auxiliary amplifier 2 at the check points (points of sensing the drain current) CP11, CP12 is a reference value Idp1.

The drain current Idp of the auxiliary amplifier 2 is sensed by, for example, the current sensing circuit 3 in FIG. 5, and Idp=Idp1 corresponds to the characteristic curve PL11 described with reference to FIG. 6. In this case, Vg=0, i.e., gain compensation by the gate voltage Vg is not carried out.

In contrast, when the threshold value shift occurs in the auxiliary amplifier 2 (characteristic curve TL1a) as illustrated in FIG. 7B, for example, at the check point CP11, the drain current Idp sensed by the current sensing circuit 3 becomes lower than the reference value Idp1 by ΔIdp1. For example, at the check point CP12, the drain current Idp sensed by the current sensing circuit 3 becomes lower than the reference value Idp1 by ΔIdp2.

When the differences ΔIdp1 and ΔIdp2 between the drain currents Idp and the reference value Idp1 are revealed in such a manner, the gate voltage Vg of the auxiliary amplifier 2, suitable for gain compensation, can be obtained on the basis of the characteristic curves PL11 to PL17 which have been learned and prepared in advance. In other words, the threshold value shift determination circuit 4 in FIG. 5 determines the threshold value shift in the auxiliary amplifier 2 when the value (Idp) of the current passing through the auxiliary amplifier 2 deviates from the reference value (Idp1), and determines the gate voltage Vg of the auxiliary amplifier 2.

The bias voltage adjustment circuit 5 adjusts the gate voltage Vg of the auxiliary amplifier 2 with respect to the input power into the auxiliary amplifier 2 so that the drain current value (Idp) of the auxiliary amplifier 2 is allowed to approach the reference value (Idp1) of the drain current with respect to the input power into the auxiliary amplifier 2. As a result, appropriate distortion compensation for the threshold value shift occurring in the auxiliary amplifier 2 is enabled.

Figure 8A:
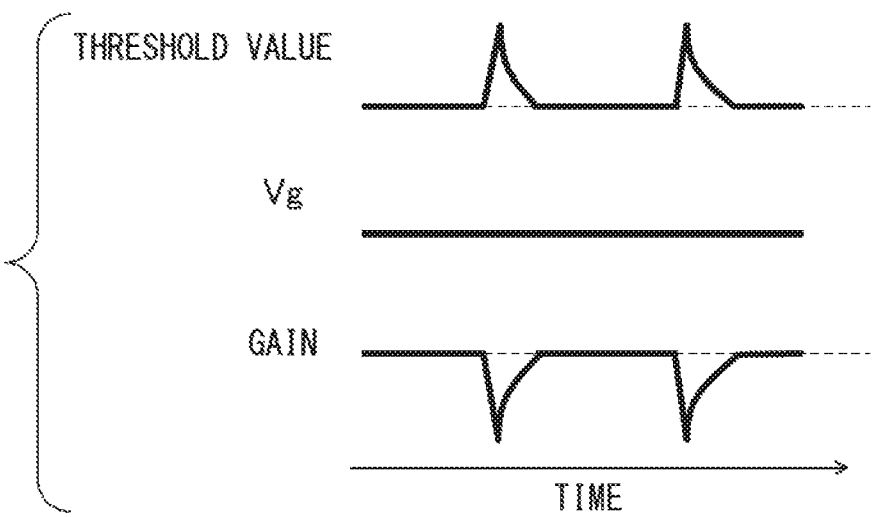
FIG. 8A and FIG. 8B are views for explaining the effects of the power amplification apparatus of the present embodiment.
Figure 8B:
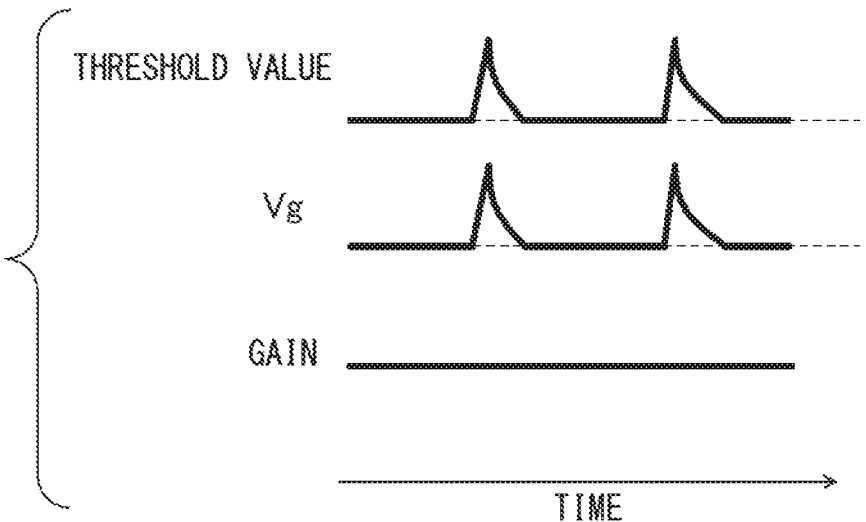

FIG. 8A and FIG. 8B are views for explaining the effects of the power amplification apparatus of the present embodiment. FIG. 8A illustrates the operation of a power amplification apparatus to which the present embodiment does not apply, and FIG. 8B illustrates the operation of the power amplification apparatus of the present embodiment. FIG. 8A and FIG. 8B schematically illustrate variations in threshold value, gate voltage (bias voltage) Vg, and gain with respect to a time t on the horizontal axis.

In the power amplification apparatus to which the present embodiment is not applied, as illustrated in FIG. 8A, for example, when a threshold value in the auxiliary amplifier (102) shifts to a higher level, a gain decreases in accordance with the amount of the threshold value shift.

In contrast, in the power amplification apparatus of the present embodiment, as illustrated in FIG. 8B, for example, even when a threshold value in the auxiliary amplifier 2 shifts to a higher level, a gate voltage Vg varies so that the amount of the threshold value shift is canceled (compensated). As a result, a gain can be kept constant even when a threshold value shift occurs in the auxiliary amplifier 2.

Figure 9A:
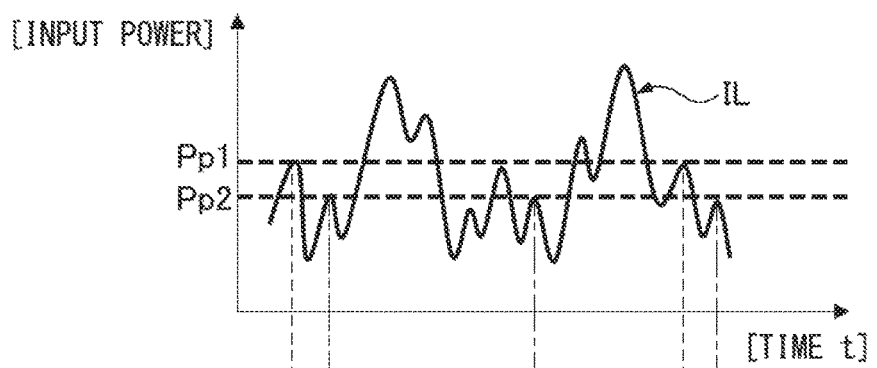
FIG. 9A and FIG. 9B are views for explaining an example of operation in a second embodiment of a power amplification apparatus.
Figure 9B:
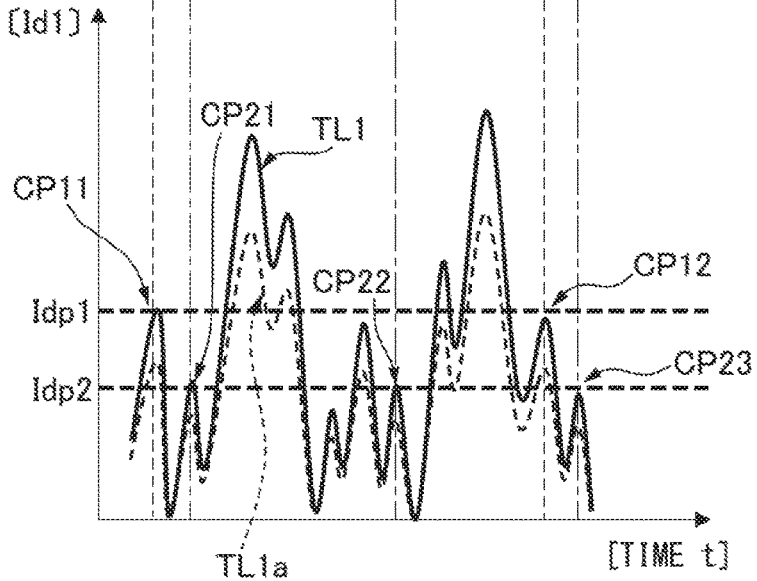

FIG. 9A and FIG. 9B are views for explaining an example of operation in a second embodiment of a power amplification apparatus. FIG. 9A represents a relationship between a time t and an input power, and FIG. 9B represents a relationship between a time t and a drain current Idp. As is apparent from comparisons of FIG. 9A and FIG. 9B as well as FIG. 7A and FIG. 7B described above, one reference value Idp1 is set in the first embodiment while two reference values Idp1 and Idp2 are set in the power amplification apparatus of the second embodiment.

In the power amplification apparatus of the second embodiment, variations in the drain current value (Idp) of the auxiliary amplifier 2 with respect to plural (two) input powers (Pp1, Pp2) into the auxiliary amplifier 2 are detected to adjust the gate voltage Vg of the auxiliary amplifier 2. In other words, a reference value Idp2 with respect to the input power Pp2 is further added to detect the variations in drain current Idp and to adjust the gate voltage Vg in consideration of a case in which a variation in drain current Idp greatly deviates from the reference value Idp1 in FIG. 7B.

Accordingly, not only CP11 and CP12 described with reference to FIG. 7A and FIG. 7B but also, for example, CP21, CP22, and CP23 at which the maximum value of the input power into the auxiliary amplifier 2 is Pp2 are added as points at which the drain current Idp of the auxiliary amplifier 2 is checked.

When no threshold value shift occurs in the auxiliary amplifier 2 (characteristic curve TL1), for example, the drain current Idp of the auxiliary amplifier 2 at the check points CP21, CP22, and CP23 is the reference value Idp2.

When the reference values of the drain current Idp of the auxiliary amplifier 2 are intended to be two reference values Idp1 and Idp2, input power/drain current characteristics with respect to each gate voltage Vg for the corresponding reference values are learned in advance.

As described above, according to the power amplification apparatus of the second embodiment, for example, the number of the points (check points) of sensing the drain current Idp of the auxiliary amplifier 2 is increased in comparison with the power amplification apparatus of the first embodiment, and therefore, more accurate adjustment of the gate voltage Vg for compensating the amount of the threshold value shift is enabled. It will be appreciated that the reference values of the drain current Idp of the auxiliary amplifier 2 may be three or more reference values, not just the two reference values Idp1 and Idp2.

Figure 10:
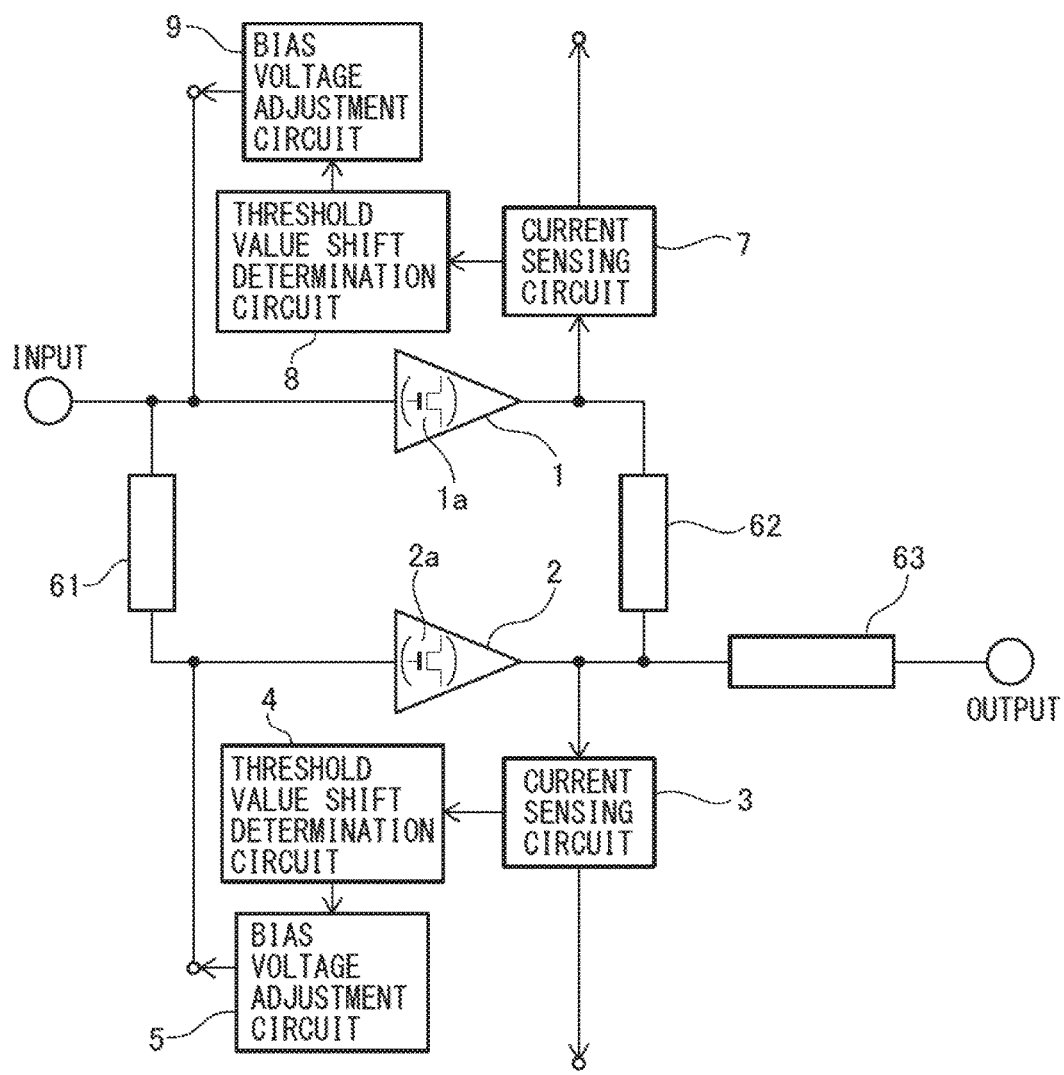
FIG. 10 is a block diagram illustrating another embodiment of a power amplification apparatus.

FIG. 10 is a block diagram illustrating another embodiment of a power amplification apparatus. As is apparent from comparisons of FIG. 10 and FIG. 5 described above, in the power amplification apparatus (Doherty amplifier) illustrated in FIG. 10, a current sensing circuit 7, a threshold value shift determination circuit 8, and a bias voltage adjustment circuit 9 are also disposed in a main amplifier 1, like in an auxiliary amplifier 2.

In other words, in the Doherty amplifier, the main amplifier 1 ordinarily operates in Class A or Class AB, a certain level of current (drain current Idc) is intended to pass through the main amplifier 1, and, for example, a variation in drain current Idc before and after occurrence of a threshold value shift is intended to be detected. In other words, in the main amplifier 1, the idling current (drain current Idc) is a value of a certain level or greater, and therefore, the idling current value is determined from the minimum value of the drain current value in RF operation, thereby enabling detection of the amount of the threshold value shift.

In the main amplifier 1, however, the drain current Idc may also be about 0 [A] like in the auxiliary amplifier 2, for example, when the drain current (idling current) Idc is reduced to a low level for power saving, or when the amount of the threshold value shift becomes a certain level or higher. In this case, it is also difficult to determine a threshold value shift on the basis of the minimum value of the drain current Idc in the main amplifier 1.

Thus, the current sensing circuit (main amplifier current sensing circuit) 7, the threshold value shift determination circuit (main amplifier threshold value shift determination circuit) 8, and the bias voltage adjustment circuit (main amplifier bias voltage adjustment circuit) 9 are disposed in the main amplifier 1, like in the auxiliary amplifier 2.

The current sensing circuit 7 and the threshold value shift determination circuit 8 function as a threshold value shift detector (main amplifier threshold value shift detector), and detect the threshold value shift in the main amplifier 1. The current sensing circuit 7 senses the value of current passing through the main amplifier 1 with respect to a predetermined input power into the main amplifier 1.

For the main amplifier 1, for example, a relationship between an input power and the drain current value Idc of the main amplifier 1, i.e., how a relationship between each input power and each drain current value varies can also be learned in advance like in the auxiliary amplifier 2.

As a result, the amount of the threshold value shift can be detected, and appropriate distortion compensation can be performed by adjusting the gate voltage of the main amplifier 1, for example, even when the threshold value shift is great, and it is difficult to determine the threshold value shift on the basis of the minimum value of the drain current Idc.

Figure 11:
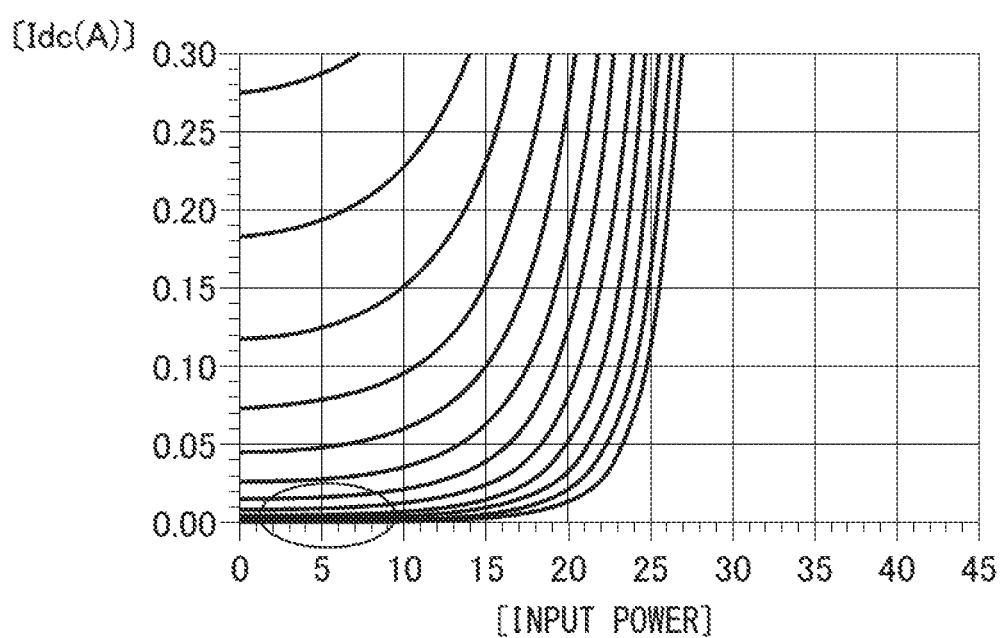
FIG. 11 is a view (1) for explaining an example of the operation of the power amplification apparatus illustrated in FIG. 10.
Figure 12A:
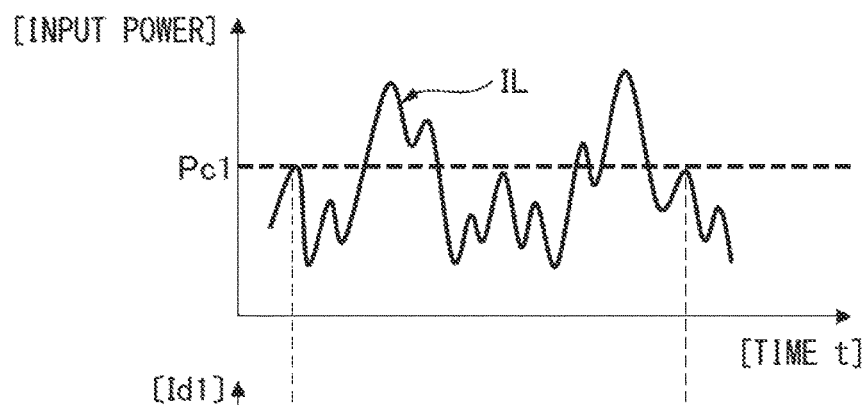
FIG. 12A and FIG. 12B are views (2) for explaining an example of the operation of the power amplification apparatus illustrated in FIG. 10.
Figure 12B:
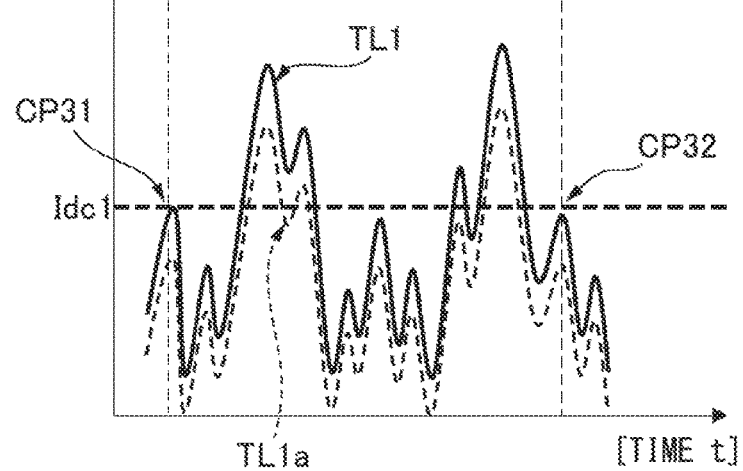

FIG. 11, FIG. 12A, and FIG. 12B are views for explaining an example of the operation of the power amplification apparatus illustrated in FIG. 10. FIG. 11 represents characteristics of the main amplifier 1 (characteristics of input power/current (drain current Idc) passing through main amplifier 1), FIG. 12A represents a relationship between a time t and an input power, and FIG. 12B represents a relationship between a time t and a drain current Idc.

FIG. 11 for the main amplifier 1 corresponds to FIG. 6 for the auxiliary amplifier 2, and FIG. 12A and FIG. 12B for the main amplifier 1 correspond to FIG. 7A and FIG. 7B for the auxiliary amplifier 2. In other words, the input power/drain current characteristics are learned in advance by, for example, sequentially varying the gate voltage of the main amplifier 1 with respect to an input power Pc1 into the main amplifier 1, as illustrated in FIG. 11.

Like in the case of the description with reference to FIG. 6, a point at which the drain current Idc of the main amplifier 1 gently varies with respect to a variation in the gate voltage of the main amplifier 1 is preferred for the drain current Idc of the main amplifier 1 in the case of determining the characteristic curves (learning input power/drain current characteristics).

As illustrated in FIG. 11, for example, the drain current Idc of the main amplifier 1 may also be about 0 [A] in the main amplifier 1. In this case, it is also difficult to determine a threshold value shift on the basis of the minimum value of the drain current Idc in the main amplifier 1.

Thus, as illustrated in FIG. 12B, the drain current Idc of the main amplifier 1 is also compared with a reference value Idc1 at check points CP31 and CP32 for the main amplifier 1, thereby determining a threshold value shift in a manner similar to that in the case of the descriptions with reference to FIG. 6, FIG. 7A, and FIG. 7B.

In other words, the drain current Idc of the main amplifier 1 is sensed by, for example, the current sensing circuit 7 in FIG. 10, and the threshold value shift in the main amplifier 1 is determined by the threshold value shift determination circuit 8. Like the bias voltage adjustment circuit 5 of the auxiliary amplifier 2 in FIG. 5, the bias voltage adjustment circuit 9 of the main amplifier 1 adjusts the gate voltage of the main amplifier 1.

As a result, appropriate distortion compensation for the threshold value shift occurring in the main amplifier 1 can be performed, for example, even when the drain current Idc of the main amplifier 1 is about 0 [A]. It will be appreciated that the numbers of the reference values of the drain current Idc for the main amplifier 1 can also be plural in the power amplification apparatus illustrated in FIG. 10 to FIG. 12B, like in the case of the description with reference to FIG. 9A and FIG. 9B.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power amplification apparatus which is a Doherty power amplification apparatus including a main amplifier configured to amplify an input signal, and an auxiliary amplifier configured to amplify the input signal when a level of the input signal is higher than a predetermined level, the power amplification apparatus comprising:
    an auxiliary amplifier threshold value shift detector configured to detect a threshold value shift in the auxiliary amplifier; and an auxiliary amplifier bias voltage adjustment circuit configured to adjust a bias voltage of the auxiliary amplifier based on the detected threshold value shift in the auxiliary amplifier, wherein the auxiliary amplifier threshold value shift detector includes:

an auxiliary amplifier current sensing circuit configured to sense a value of current passing through the auxiliary amplifier with respect to a predetermined input power into the auxiliary amplifier; and an auxiliary amplifier threshold value shift determination circuit configured to determine a threshold value shift in the auxiliary amplifier when the sensed value of the current passing through the auxiliary amplifier deviates from a reference value with respect to the predetermined input power into the auxiliary amplifier.

2. The power amplification apparatus according to claim 1, wherein the auxiliary amplifier threshold value shift determination circuit is configured to compare the sensed value of the current passing through the auxiliary amplifier with corresponding reference values of currents passing through the auxiliary amplifier with respect to a plurality of input powers to the auxiliary amplifier, and determine a threshold value shift in the auxiliary amplifier.

3. The power amplification apparatus according to claim 1, wherein the auxiliary amplifier bias voltage adjustment circuit is configured to adjust a bias voltage of the auxiliary amplifier with respect to an input power into the auxiliary amplifier so that the sensed value of the current passing through the auxiliary amplifier is allowed to approach a reference value of the current passing through the auxiliary amplifier with respect to the input power into the auxiliary amplifier.

4. The power amplification apparatus according to claim 3, wherein a reference value of the current passing through the auxiliary amplifier, and a bias voltage of the auxiliary amplifier which compensates a threshold value shift in the auxiliary amplifier, are learned and prepared in advance for a plurality of input powers.

5. The power amplification apparatus according to claim 3, wherein the auxiliary amplifier bias voltage adjustment circuit is configured to increase an initial value of a bias voltage of the auxiliary amplifier so that a current value of the auxiliary amplifier is allowed to approach the reference value when a value of the current passing through the auxiliary amplifier, the value being sensed by the auxiliary amplifier current sensing circuit, is less than the reference value with respect to a predetermined input power into the auxiliary amplifier, and a threshold voltage of the auxiliary amplifier, determined by the auxiliary amplifier threshold value shift determination circuit, is lower than a reference threshold voltage.

6. A power amplification apparatus which is a Doherty power amplification apparatus including a main amplifier configured to amplify an input signal, and an auxiliary amplifier configured to amplify the input signal when a level of the input signal is higher than a predetermined level, the power amplification apparatus comprising:

an auxiliary amplifier threshold value shift detector configured to detect a threshold value shift in the auxiliary amplifier;

an auxiliary amplifier bias voltage adjustment circuit configured to adjust a bias voltage of the auxiliary amplifier based on the detected threshold value shift in the auxiliary amplifier; and a main amplifier threshold value shift detector configured to detect a threshold value shift in the main amplifier; and a main amplifier bias voltage adjustment circuit configured to adjust a bias voltage of the main amplifier based on the detected threshold value shift in the main amplifier, wherein the main amplifier threshold value shift detector includes:

a main amplifier current sensing circuit configured to sense a value of current passing through the main amplifier with respect to a predetermined input power into the main amplifier; and a main amplifier threshold value shift determination circuit configured to determine a threshold value shift in the main amplifier when the sensed value of the current passing through the main amplifier deviates from a reference value with respect to the predetermined input power into the main amplifier.

7. The power amplification apparatus according to claim 6, wherein the main amplifier threshold value shift determination circuit is configured to compare the sensed value of the current passing through the main amplifier with corresponding reference values of currents passing through the main amplifier with respect to a plurality of input powers into the main amplifier, and determine the threshold value shift in the main amplifier.

8. The power amplification apparatus according to claim 6, wherein the main amplifier bias voltage adjustment circuit is configured to adjust a bias voltage of the main amplifier with respect to an input power into the main amplifier so that the sensed value of the current passing through the main amplifier is allowed to approach a reference value of current passing through the main amplifier with respect to the input power into the main amplifier.

9. The power amplification apparatus according to claim 1, wherein a GaN device is used in the power amplification apparatus;

the main amplifier is configured to operate in Class A or Class AB; and the auxiliary amplifier is configured to operate in Class B or Class C.

10. A method for controlling a Doherty power amplification apparatus including a main amplifier configured to amplify an input signal, and an auxiliary amplifier configured to amplify the input signal when a level of the input signal is higher than a predetermined level, the method for controlling the power amplification apparatus comprising:

detecting a threshold value shift in the auxiliary amplifier; and adjusting a bias voltage of the auxiliary amplifier based on the detected threshold value shift, wherein the detecting the threshold value shift includes:

sensing a value of current passing through the auxiliary amplifier with respect to a predetermined input power into the auxiliary amplifier; and determining the threshold value shift in the auxiliary amplifier when the sensed value of the current passing through the auxiliary amplifier deviates from a reference value with respect to the predetermined input power into the auxiliary amplifier.

11. The method for controlling a power amplification apparatus according to claim 10, wherein
the determining the threshold value shift in the auxiliary amplifier includes:
comparing the sensed value of the current passing through the auxiliary amplifier with corresponding reference values of currents passing through the auxiliary amplifier with respect to a plurality of input powers into the auxiliary amplifier, thereby determining the threshold value shift in the auxiliary amplifier.

12. The method for controlling a power amplification apparatus according to claim 10, wherein
the adjusting the bias voltage of the auxiliary amplifier includes:
adjusting the bias voltage of the auxiliary amplifier with respect to an input power into the auxiliary amplifier so that a sensed value of the current passing through the auxiliary amplifier is allowed to approach a reference value of the current passing through the auxiliary amplifier with respect to the input power into the auxiliary amplifier.

\* \* \* \* \*